United States Patent
Ketelaer

(10) Patent No.: US 10,569,342 B2
(45) Date of Patent: Feb. 25, 2020

(54) METHOD AND DEVICE FOR APPLYING A SURFACE STRUCTURING TO A WORKPIECE ON A MACHINE TOOL

(71) Applicant: SAUER GmbH, Stipshausen (DE)

(72) Inventor: Jens Ketelaer, Wiesbaden (DE)

(73) Assignee: SAUER GMPH, Stipshausen (DE)

( * ) Notice: Subject to any disclaimer, the term of this patent is extended or adjusted under 35 U.S.C. 154(b) by 216 days.

(21) Appl. No.: 15/671,673

(22) Filed: Aug. 8, 2017

(65) Prior Publication Data
US 2018/0036807 A1    Feb. 8, 2018

(30) Foreign Application Priority Data
Aug. 8, 2016   (DE) ........................ 10 2016 214 697

(51) Int. Cl.
| | |
|---|---|
| *B23B 29/12* | (2006.01) |
| *B24B 1/04* | (2006.01) |
| *H03K 5/01* | (2006.01) |

(52) U.S. Cl.
CPC .............. *B23B 29/125* (2013.01); *B24B 1/04* (2013.01); *H03K 5/01* (2013.01)

(58) Field of Classification Search
CPC .................................................... B23B 29/125
USPC .................................................... 318/119, 34
See application file for complete search history.

(56) References Cited

U.S. PATENT DOCUMENTS

| | | | | |
|---|---|---|---|---|
| 4,918,427 A | * | 4/1990 | Thomas .............. | G08B 21/187 340/680 |
| 6,604,013 B1 | * | 8/2003 | Hamidieh .......... | G05B 19/4065 700/174 |
| 2014/0216216 A1 | | 8/2014 | Hessenkamper | |
| 2015/0352713 A1 | | 12/2015 | Takazakura et al. | |

FOREIGN PATENT DOCUMENTS

| | | |
|---|---|---|
| DE | 10 2010 048 638 A1 | 1/2012 |
| DE | 10 2011 077 568 A1 | 12/2012 |
| DE | 10 2013 103 843 A1 | 10/2014 |
| DE | 10 2012 002 140 B4 | 11/2014 |
| EP | 2 946 859 A1 | 11/2015 |
| JP | 2014-523348 A | 9/2014 |

OTHER PUBLICATIONS

Sep. 26, 2018 Office Action issued in Japanese Patent Application No. 2017-149734.
Jan. 25, 2018 Search Report issued in European Patent Application No. 17185219.7.

\* cited by examiner

*Primary Examiner* — David Luo
(74) *Attorney, Agent, or Firm* — Oliff PLC

(57) ABSTRACT

A method and a device applying surface structuring to a surface of a workpiece on a machine tool, performing a feed motion of a milling cutter which is rotationally driven by a work spindle of the machine tool, received in a tool head of the machine tool and has at least one protruding cutting edge along the surface of the workpiece; applying the surface structuring in accordance with a predetermined pattern to the surface of the workpiece during the feed motion of the (Continued)

milling cutter on the basis of a control signal to an actuator which is integrated in the tool head and is configured to drive a vibration of the milling cutter on the basis of the control signal, wherein the control signal contains high-frequency carrier signal and a useful signal which modulates the carrier signal and which is generated on the basis of data indicating the predetermined pattern.

16 Claims, 6 Drawing Sheets

METHOD AND DEVICE FOR APPLYING A SURFACE STRUCTURING TO A WORKPIECE ON A MACHINE TOOL

The present invention relates to a method for applying a surface structuring to a surface of a workpiece on a machine tool. The present invention also relates to a device and a machine tool, on which the above mentioned method can be carried out. Furthermore, the present invention relates to a computer program product which can be used to carry out the above mentioned method.

BACKGROUND OF THE INVENTION

DE 10 2012 002 140 B4 discloses a method of the generic type, in particular a face milling method, for applying a surface structuring to a surface of a workpiece. Such a surface structuring or marking of the surface can serve e.g. for decorative purposes or for coding the component or workpiece by applying e.g. an image pattern and/or text pattern to the surface of the workpiece.

Here, a milling cutter or a face-milling cutter can be used on a machine tool, said cutter having e.g. an axially protruding cutting edge that is not disposed in the tool axis and rotates when the tool is rotationally driven about the tool axis. Other than in the simple face milling, the milling cutter has e.g. a tip which can be formed e.g. by a protruding cutting edge of the milling cutter, and, where appropriate, can be produced by grinding back or dismantling the other cutting edge parts.

The surface of the workpiece is structured during the face-milling process, i.e. the tool (e.g. a shank cutter or a face mill or another milling cutter) moves in a rotary cutting movement on the end side over a workpiece and in so doing is moved through one or more machine axes (linear and/or rotary axes) of the machine tool. The tip and/or protruding cutting edge of the milling cutter rotating about the tool axis is not disposed in the rotary center of the tool but further out. The precise position of the tip above the workpiece surface can be determined from the position of the tool center (e.g. the so-called tool center point) and the current angle of rotation of the tool.

If there is a short, pulse-shaped axial deflection of the tip to the front in the direction of the tool axis at positions predetermined by the desired pattern, this tool tip impresses a pixel into the workpiece surface. Owing to multiple deflections with exact positioning, it is thus possible to produce any predetermined pixel pattern (e.g. an image and/or text pattern).

However, in the prior art method according to DE 10 2012 002 140 B4, the provided dimensions of the tool head receiving the tool have to be relatively large. The described method is based on the fact that a piezo stack actuator is deflected by a rectangular pulse-shaped voltage. Since the deflection of the voltage and the length of the piezo stack are directly proportional, the tool must automatically have very large dimensions and a high power or energy has to be provided.

Furthermore, the necessary pulse-shaped voltage signals cannot be transferred by an inductive or contactless energy or signal transfer since, owing to the inductivities, the signal is always influenced. If short pulse sequences having a low frequency (about 1 to 5 kHz) are inductively transmitted, the signal is highly distorted in a disadvantageous manner on account of the high inductivities, such that the pattern or the surface structuring cannot be applied with the desired image quality. However, if slip rings are used for the signal transfer while contact is made, this is disadvantageous in industrial practice, in particular on account of the maintenance susceptibility resulting from wear and contamination.

Therefore, the prior art methods show the drawbacks of a large (and thus inconveniently dimensioned) tool head and of an energy transfer which is wire-bound (or realized by slip rings).

SUMMARY OF THE INVENTION

In order to avoid the above described drawbacks of the previously known method for applying a surface structuring to a surface of a workpiece, an object of the present invention is to provide an improved method for applying a surface structuring to a surface of a workpiece, which can be realized with smaller and more compact dimensions of the tool, tool holder and/or tool head and with an improved energy transfer or signal transfer and better image quality of the applied pattern.

In order to achieve the above described object, the invention proposes a method for applying a surface structuring to a surface of a workpiece according to claim 1. Furthermore a control device of a machine tool according to claim 14, a machine tool according to claim 15 and a computer program product according to claim 16 are proposed in an alternatively independent way. In addition, a tool head having a demodulator can be provided in an alternatively independent way. Dependent claims relate to preferred exemplary designs of the invention.

An aspect of the invention suggests in particular a method for applying a surface structuring to a surface of a workpiece on a machine tool, said method comprising: performing a feed motion of a milling cutter which is rotationally driven by a work spindle of the machine tool, is received in a tool head of the machine tool and has at least one protruding cutting edge along the surface of the workpiece, applying the surface structuring to the surface of the workpiece in accordance with a predetermined pattern during the feed motion of the milling cutter on the basis of a control signal to an actuator which is integrated in the tool head and is configured to drive a vibration of the milling cutter on the basis of the control signal, wherein the control signal comprises a high-frequency carrier signal and a useful signal which modulates the carrier signal and which is generated on the basis of data indicating the predetermined pattern.

The invention is here based on the concept that a control signal of a method for applying a surface structuring to a surface of a workpiece for driving a vibration-inducing actuator on a tool head of a machine tool, is not transferred to the tool head as a direct useful signal but as a control signal which is modulated with the useful signal with a high-frequency carrier signal. This renders possible the use of inductive energy transfer to the tool head, such that the tool head can be designed in such a way that it is a less susceptible to maintenance and more compact.

In particular, it is thus possible to make available an improved method for applying a surface structuring to a surface of a workpiece, which can be realized with smaller and more compact dimensions of the tool, tool holder and/or tool head as well as with an improved energy transfer and/or signal transfer and better image quality of the applied pattern.

According to a useful preferred embodiment of the invention, the data indicating the predetermined pattern can comprise image data, in particular bitmap image data. The advantage is that the pattern can be predetermined in a simple and efficient way.

According to a useful preferred embodiment of the invention, the control signal can be transferred in a contactless manner to a receiving unit arranged on the tool head via a sending unit arranged on the work spindle, in particular preferably by means of an inductive energy transfer.

According to a useful preferred embodiment of the invention, the actuator is driven on the basis of the modulated control signal. The advantage is that small, compact and reliable ultrasonic tool heads can be used for the method even if they have no demodulation circuit.

According to a useful preferred embodiment of the invention, the actuator is alternatively driven after the demodulation of the control signal on the basis of the useful signal. The advantage is that the image quality of the applied pattern can be further improved.

According to a useful preferred embodiment of the invention, the high-frequency carrier signal is amplitude-modulated and/or frequency-modulated on the basis of the useful signal.

According to a useful preferred embodiment of the invention, the carrier signal has a frequency in the ultrasonic range. The frequency of the carrier signal can preferably be greater than 10 kHz, in particular greater than 15 kHz and preferably less than 60 kHz. The carrier signal can preferably have a substantially sinus-shaped course.

According to a useful preferred embodiment of the invention, the actuator is configured to drive a vibration in an axial direction of the milling cutter, i.e. in particular in the direction of the tool axis of the milling cutter or in the direction of the rotational axis of the milling cutter.

According to a useful preferred embodiment of the invention, the surface structuring has a pattern corresponding to the predetermined pattern.

According to a useful preferred embodiment of the invention, the actuator is configured to drive a rotational vibration in the axial direction of the milling cutter (as required additionally or alternatively to an axial vibration).

According to a useful preferred embodiment of the invention, the actuator comprises one or more piezo elements, in particular a stack of a plurality of plate-shaped piezo elements. For example, the actuator can be made in a particularly simple and reliable way.

According to a useful preferred embodiment of the invention, an axial direction of the tool is oriented during the feed motion along the surface of the workpiece parallel to a normal vector of the surface of the workpiece. The axial direction of the tool is in particular the direction of the tool axis of the milling cutter or the direction of the rotational axis of the milling cutter.

According to a useful preferred embodiment of the invention, the tool is moved during the feed motion along the surface of the workpiece perpendicularly to a normal vector of the surface of the workpiece.

An aspect of the invention also proposes a control device of a machine tool for controlling a method according to any of the above aspects.

Such a control device comprises in particular a storage apparatus for storing data indicating the predetermined pattern and/or a receiving apparatus for receiving data indicating the predetermined pattern and/or a control signal generating apparatus for generating the control signal with the high-frequency carrier signal and the useful signal which modulates the carrier signal and which is generated on the basis of the data indicating the predetermined pattern.

An aspect of the invention also proposes a machine tool having such a control device which in particular also comprises a tool head configured to receive a milling cutter with at least one protruding cutting edge, and/or an actuator which is integrated in the tool head and is configured to drive a vibration of the accommodated milling cutter on the basis of a control signal of the control device.

An aspect of the invention also proposes a computer program product with a computer program which is stored on a computer-readable data storage medium and which can be run on a numerical control device of a numerically controlled machine tool or in a computer connected to a control device of a numerically controlled machine tool, and which is configured to control a method according to any of the above aspects on the machine tool.

Although the invention is not limited to the fact that the demodulated control signal is applied to the actuator of the tool head without the components of the carrier signals and the method can be carried out in a particularly simple way by emitting the modulated control signal directly to the actuator, it is also possible, e.g. for reasons of a desired surface quality, to emit the useful signal or the demodulated control signal to the actuator.

In this connection, embodiments propose a tool head for a machine tool, which is configured to receive, at a tool support, a milling cutter with at least one protruding cutting edge and which comprises an actuator that is configured to drive a vibration of the milling cutter on the basis of the control signal, wherein the control signal has a high-frequency carrier signal and a useful signal modulating a carrier signal, which is generated on the basis of data indicating the predetermined pattern.

Furthermore, the tool head can have a demodulation apparatus (e.g. a demodulation circuit) which is configured to demodulate the modulated control signal received by the control device of the machine tool at the tool head and/or to reconstruct the useful signal by demodulation of the modulated control signal (without or substantially without components of the carrier signal) and to provide the actuator with the demodulated control signal and/or reconstructed useful signal for controlling the vibration of the tool on the basis of the demodulated control signal or reconstructed useful signal.

Further aspects and the advantages thereof as well as advantages and more specific design possibilities of the above described aspects and features are described in the following descriptions and explanations on the attached drawings, which should by no means be regarded as limiting.

Figure 1:
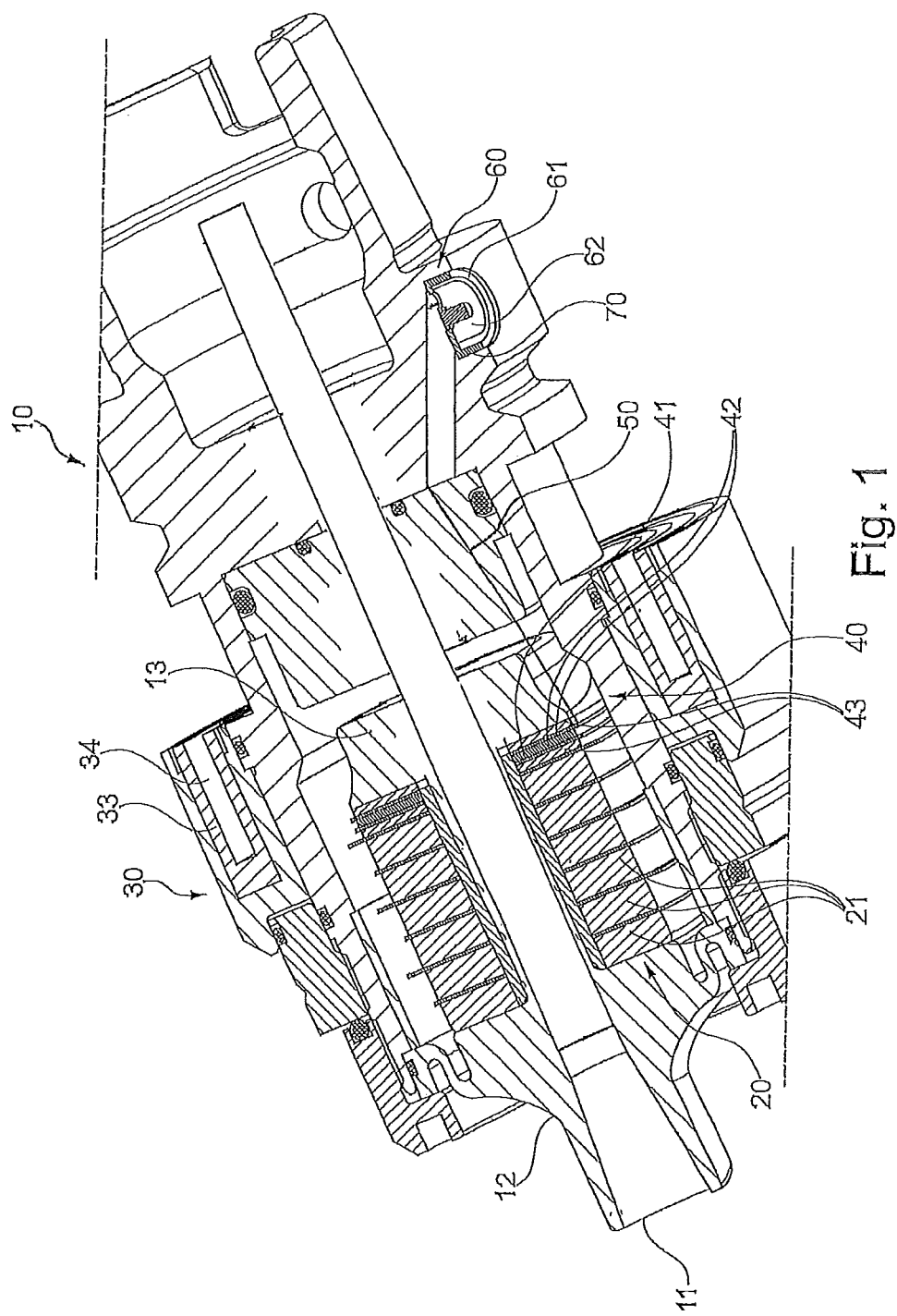
FIG. 1 shows, by way of example, a sectional view of a tool holder (tool head) which can be used in the inventive method according to embodiments.

DETAILED DESCRIPTION OF THE DRAWINGS AND PREFERRED EMBODIMENTS OF THE PRESENT INVENTION

Examples and embodiments of the present invention are described in detail below with reference to the enclosed drawings. The same and similar elements in the drawings can here be designated with the same reference signs, but sometimes also with different reference signs.

However, it should be noted that the present invention is by no means limited or confined to the below described embodiments and the design features thereof, but also comprises modifications of the embodiments, in particular those which are included by modifications of the features of the described examples and/or by combining individual or a plurality of the features of the described examples within the scope of protection of the independent claims.

FIG. 1 shows an exemplary design of a tool holder 10 (tool head) which can be used in the method according to the invention.

One end of the tool holder 10 has a tool receiving portion 11 for receiving a tool 90 (not shown in FIG. 1). The tool holder 10 accommodates e.g. a plurality of, e.g. six, perforated disk-shaped first piezo elements 21 e.g. in stacked fashion, which are connected, by way of example, via a transfer portion 12 to the tool receiving portion 11 and e.g. form an ultrasonic transducer 20 (ultrasonic generator/actuator) for transducing an electric voltage into a mechanical vibration (e.g. with a frequency in the ultrasonic range).

As an example, the mechanical vibration of the first piezo element 21 is transferred to the tool 90 via the transmission portion 12. The first piezo elements 21 can be formed e.g. as a piezo ceramic disks with electrodes attached therebetween.

The energy supply or activation of the ultrasonic transducer 20 is conducted e.g. via a transformer (first transformer) which, by way of example, comprises a first pot core 31 and a primary winding 32 (sending unit/sending coil) on the machine side (not shown in FIG. 1) and, by way of example, comprises a second pot core 33 and a secondary coil 34 (receiving unit/receiving coil) on the tool side, which, by way of example, are arranged as annular elements on the outer side of the tool holder 10.

A side of the stack of first piezo elements 21 that faces away from the tool receiving portion 11 is e.g. provided with a perforated disk-shaped piezoelectric sensor element 40 which comprises, by way of example, a piezo element 41 and two contacts 42 and is coupled e.g. mechanically to the first piezo elements 21 but is electrically insulated from the first piezo elements 21 by an insulating element 43, which can consist of a ceramic perforated disk. As an example, the piezoelectric sensor element 40 is electrically insulated from a fastening element 13, e.g. a fastening nut, by a further insulating element 43.

The fastening element 13 serves for fastening the piezoelectric sensor element 40 on the ultrasonic transducer 20 (ultrasonic generator/actuator) and the bias of the first piezo elements 21 owing to the dynamic load.

The first piezo elements 21 and the piezoelectric sensor element 40 have the same orientation, as a result of which, on the one hand, the generation and the detection of the vibration in the same direction is made possible and, on the other hand, a space-saving arrangement of the elements in the tool holder 10 (tool head) is achieved.

The piezoelectric sensor element 40 transduces the mechanical vibrations of the vibratory system, which comprises the tool 90, the transmission portion 12, the ultrasonic transducer 20 and the piezoelectric sensor element 40, into a sensor signal which, by way of example, is transferred as an electric voltage via a wire connection 50 from the piezoelectric sensor element 40 through the tool holder 10 to a sending element on the outer side of the tool holder 10.

The sensor signal is transferred e.g. in contactless fashion from the sending element 61 and 62 at a bore 70 to a receiving element on the machine side (not shown in FIG. 1).

The sending element 61 and 62 is e.g. part of a further transformer (second transformer) and comprises e.g. a first ferrite core and a primary winding; the receiving element is also part of the second transformer and comprises a second ferrite core and a secondary winding. However, it is also possible to provide an optical sending element.

Therefore, the sensor signal can be transferred inductively from the tool holder 10 to a sensor signal assessment device on the machine side.

Figure 2:
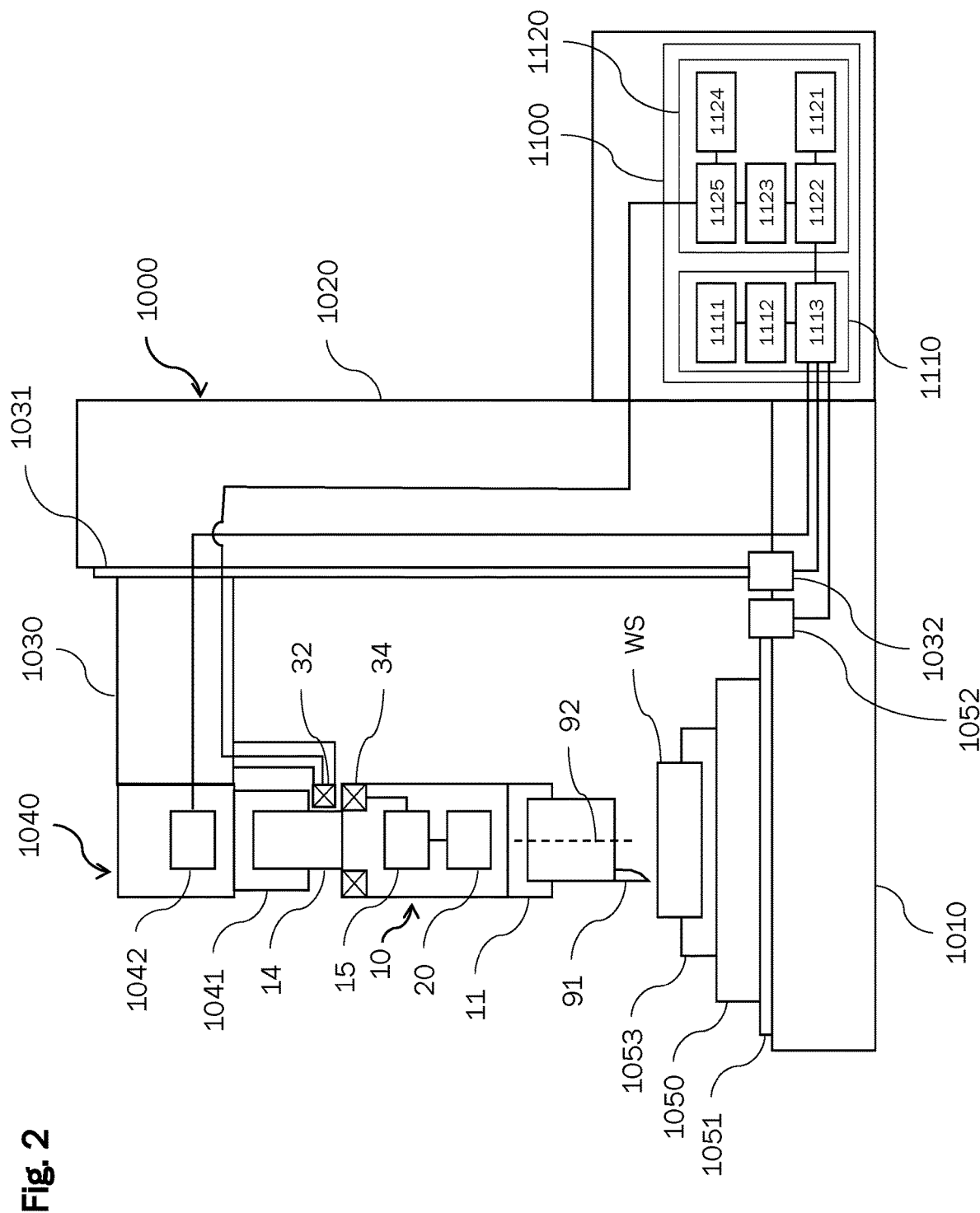
FIG. 2 shows, by way of example, a schematic diagram of a machine tool which has a tool holder (tool head) and can be used in the inventive method according to the embodiments.

FIG. 2 shows, by way of example, a schematic diagram of a machine tool 1000 according to an embodiment of the invention, which has a tool holder 10 (tool head) that can be used in the inventive method according to embodiments.

The machine tool 1000 can e.g. be made as a numerically controllable milling machine, numerically controllable universal milling machine or as a numerically controllable machining center. In order to control a relative movement between tool and workpiece, the machine tool can have a plurality of controllable linear axes (usually referred to as e.g. X-axis, Y-axis and/or Z-axis) and/or one or more rotary or rotational axes (usually designated e.g. A-axis, B-axis and/or C-axis).

For example, the machine tool 1000 in FIG. 2 has a machine bed 1010, a machine column 1020 and a spindle head 1030, wherein the machine bed 1010 supports e.g. a workpiece table 1050 and the spindle head 1030 supports e.g. a work spindle 1040.

The tool table 1050 is e.g. mounted in a linearly movable fashion in a horizontal direction on horizontal linear guideways 1050, which are arranged on the machine bed 1010 in a horizontal direction, and is movably controllable via a linear drive 1052 of a first linear axis of the machine tool 1000. As an example, a workpiece WS is clamped in a workpiece clamping apparatus 1053 on the workpiece table.

As an example, the spindle head 1030 is linearly and movably mounted in the vertical direction on vertical linear guideways 1050, which are arranged on the machine column 1020 in a vertical direction, and can be movably controlled via a linear drive 1032 of a second linear axis of the machine tool 1000, such that the work spindle 1040, which accommodates a tool head 10 (tool holder) holding a tool 90, is also vertically movable.

In further embodiments, one or more further linear axes can also be provided, e.g. to additionally render possible a linear movement of the workpiece relative to the tool in a direction perpendicular to the drawing plane of FIG. 2.

Furthermore, one or more rotary or rotational axes can be provided, e.g. a rotary axis having a rotary axis drive for rotating the tool table 1050 (so-called rotary table).

A relative movement of the tool 90 relative to the workpiece WS can be controlled by means of the previously described linear axes and, where appropriate, round or rotary axes and/or the drives thereof.

For this purpose, a control device 1100 of the machine tool 1000 has a machine control apparatus 1110, which, by way of example, comprises a CNC or NC control apparatus 1112, which is configured, e.g. on the basis of NC data stored in a storage device 111, to control the functions or machining processes on the machine tool 1000. In addition, the machine control device 1110 has e.g. a PLC or SPS apparatus 1113 ("PLC" stands for programmable logic controller and "SPS" for storage programmable controller).

The PLC and/or SPS apparatus 1113 is configured in a particularly preferred fashion to send, on the basis of control commands of the NC control apparatus 1112 or, where appropriate, also independently of the NC control apparatus 1112, control signals to actuators of the machine tool, e.g. to the linear drives 152 or 1032 of the linear axes or generally to drives of the machine axes or also to the spindle drive 1042 of the work spindle 1040.

In addition, the PLC and/or SPS apparatus 1113 is configured to receive or read out sensor signals from position measurement sensors (not shown) of the machine tool 1000, which in real time indicate during processing measured actual positions of the drives and/or machine axes, and, where appropriate, pass them on to the NC control apparatus 1112. The PLC and/or SPS apparatus 1113 can also be configured to render possible that other machine-internal or external apparatuses and/or devices read out positional data at the PLC and/or SPS apparatus 1113, which indicate the actual positions of the drives and/or machine axes.

In addition to the above mentioned spindle drive 1042, the work spindle 1040 also has a tool support 1041 (tool receiving portion) where the tool head 10 is received and can be rotationally driven by means of the spindle drive 1042 (in particular for generating the cutting movement).

The tool head 10 is merely shown schematically and has e.g. a tool cut surface body 14 (e.g. a machine taper or steep taper or hollow shank taper or also a Morse taper or other tool cut surfaces), by means of which the tool head 10 is received on the tool support 1041 of the work spindle 1040. For example, the tool head 10 can be designed by analogy with FIG. 1. In contrast to the tool holder 10 of the embodiment according to FIG. 1, the tool head 10 in FIG. 2 additionally has a demodulator 15 described in more detail below.

The tool head 10 has e.g. an inductive receiving unit 32 (e.g. by analogy with the secondary coil or winding 34 in FIG. 1) for the contactless or inductive receipt of a control signal from the sending unit 32 (primary coil or winding), which is attached to the spindle head (or the spindle).

As an example, the tool head 10 in FIG. 2 also has an actuator 20 (e.g. ultrasonic transducer or ultrasonic generator, where appropriate, e.g. comprising one or more piezo elements) which is configured to cause, on the basis of the control signal, the tool head 10 and/or the tool 90 accommodated in the tool head 10 to vibrate (in particular in the direction of the tool axis 92), preferably in particular in the ultrasonic range, i.e. in particular at ultrasonic frequencies or at frequencies above 10 kHz or in particular e.g. above 15 kHz up to 60 kHz.

Furthermore, the tool head 10 in FIG. 2 has e.g. a demodulator 15 (e.g. a demodulating circuit, where appropriate having a microcontroller), which is arranged upstream of the actuator 20 and demodulates the control signal received via the receiving unit 32 or reconstructs a low-frequency carrier signal, by means of which a high-frequency carrier signal is modulated on the side of the control device.

However, the invention is not limited to tool heads having demodulators 15 but the modulated control signal can also be transferred directly to the actuator in other embodiments.

The tool head 10 additionally has the tool receiving portion 11, where the milling cutter 90 is received or held. The tool 90 has a tool axis 92 about which the tool is rotationally driven via the spindle drive 1042. The tool tip 91 is formed e.g. by a cutting edge of a milling cutter, which is arranged in an axial direction of the tool axis 92 in such a way that it protrudes from an outer side of the milling cutter 90, i.e. is in particular spaced apart from the tool axis 92. When the tool 90 is rotationally driven, the cutting edge of the milling cutter or tool tip 91 rotates about the tool axis 92.

In order to drive the actuator 20 or to control the vibration of the tool 90, the control device 1100 of the machine tool 1000 has a further control apparatus 1120, which generates the control signal and outputs it via the sending unit 32 to the tool head 10 for transferring it to the receiving apparatus 34 for the actuator 20. In further embodiments, the control apparatus 1120 can also be integrated in the machine control apparatus 1110 and/or comprises an external data processing device, e.g. a computer, or can be designed by an externally connected data processing device, e.g. a computer.

The control apparatus 1120 comprises e.g. a generator 1124 for generating the high-frequency carrier signal. The high-frequency carrier signal can be e.g. a substantially periodic or preferably substantially sinus-shaped carrier signal which preferably has a predetermined frequency and/or a predetermined amplitude. The frequency of the carrier signal is a high frequency (i.e. in particular a frequency greater than 10 kHz, preferably greater than 15 kHz) and is preferably in the ultrasonic range.

In addition, the control apparatus 1120 comprises, by way of example, a storage apparatus 1121 for storing pattern data indicating the pattern or image pattern and/or text pattern to be applied to the surface of the workpiece WS. The pattern data can here be image data (e.g. data storing a bitmap graphics or other image data formats) which provides the pattern in an image data format.

Alternatively, the control device 1120 can store in the storage apparatus 1121 pattern position data which is generated on the basis of pattern data or image data indicating the pattern (e.g. data storing a bitmap graphics or other image data formats) and already indicates a position-image/pattern relationship, i.e. data which indicates positions on the workpiece surface where the image and/or text pattern shall be applied, pattern position data which indicates deflection positions in connection with a plurality of cutter positions of the tool tip 91 on the surface of the workpiece WS on the basis of the predetermined pattern (e.g. with greater deflection at positions of the pattern and with smaller or no deflection at positions where no pattern shall be applied). This can be prepared and previously stored e.g. as a table.

Furthermore, the control apparatus 1120 comprises, by way of example, a data processing apparatus 1122, which is configured to read out the data from the storage apparatus 1121 and in addition can read out positions, in particular axis positions, from the machine control apparatus 1110. This can preferably be done in real time while the workpiece WS is processed, wherein, on the one hand, the current actual positions of the axes and drives of the machine tool 1000 can preferably be read out e.g. from the PLC and/or SPS control apparatus 1113 (and/or from the NC control 1112) in real time or, on the other hand, current target positions can be read out from the NC controller 1112.

On the basis of the read-out position data of the machine control, the data processing apparatus 1122 is preferably configured in particular to calculate the cutter position of the tool tip 91 of the tool 90 relative to the workpiece WS (e.g. on the basis of the calculated position of the tool axis 92, on the basis of the axis positions of the machine tool 1000 and on the basis of the angular position of the work spindle, in particular in consideration of the distance of the workpiece tip from the tool axis 92).

Alternatively, it is also possible that the position of the tool axis 92 and/or the cutter position of the tool tip 91 is calculated in the NC controller 1112 and is read out by the data processing apparatus 1122.

On the basis of the calculated or read-out cutter position of the tool tip 91 of the tool 90 relative to the workpiece WS and in comparison with the data of the storage device 1121 that indicate the pattern, the data processing apparatus 1122 is configured to determine or calculate a currently desired deflection of the tool 90 on the basis of the desired pattern on the current cutter position and output it to a carrier signal generator 1123 as a target value.

On the basis of the calculations or requirements of the data processing apparatus 1122, the useful signal generator 1123 generates an optionally continuous useful signal with low-frequency pulses, in particular at (average) frequencies of less than 10 kHz and preferably less than 7 or in particular 5, kHz and preferably on the average greater than about 1 kHz. The pulses of the useful signal can be rectangular, for example (see e.g. FIG. 5); however, the pulses of the useful signal can also be Gaussian-shaped or have a shape in accordance with a sinusoidal half-wave.

Furthermore, the control apparatus 1120 also comprises a modulator 1125 (or modulating circuit, where necessary with a microcontroller) which is configured to modulate the high-frequency carrier signal which is generated by the generator 1124 with the useful signal generated by the useful signal generator 1123 and thus generate the modulated control signal on the basis of the carrier and useful signals, which is to be outputted to the tool head 10.

It is herewith possible to modulate the carrier signal with the useful signal by amplitude modulation. However, it is also possible to modulate the carrier signal with the useful signal by frequency modulation. Combinations of amplitude and frequency modulations are also possible. If a tool head 10 is provided with a demodulator 15, the useful signal can be reconstructed there and the type of modulation only plays a minor part.

However, if the tool head 10 does not comprise a demodulator and the modulated control signal is directly outputted to the actuator 20, the type of modulation changes the appearance of the applied pattern. In this case, it is possible in some embodiments that the operator can adjust as desired and required whether an amplitude or frequency modulation or a combination thereof shall be used.

On the one hand, it is possible in some embodiments without demodulator at the tool head to modulate the carrier signal with the useful signal by amplitude modulation. As a result, a greater deflection of the actuator 20 is produced during a pulse of the useful signal on account of the higher amplitude. Therefore, the impacts of the tool cutting edge of the tool tip 91 during a pulse of the useful signal at constant frequency of the carrier signal penetrate the surface of the workpiece 90 more deeply (greater penetration depth at a pulse of the useful signal), such that the pattern on the surface can be produced by depths and heights in the surface structuring.

However, it is also possible to modulate, in the case of embodiments without demodulator on the tool head, the carrier signal with the useful signal by frequency modulation. As a result, e.g. during a pulse of the useful signal at constant amplitude another (preferably higher) frequency of the actuator 20 is produced on account of the higher frequency of the control signal. Therefore, the impacts of the tool cutting edge of the tool tip 91 have the same depth with constant amplitude of the deflection and with different frequencies (e.g. higher frequency at the pulse of the useful signal), such that, on the surface of the workpiece 90, the pattern can be produced on the surface by different shadings in the surface structuring.

It is likewise possible to modulate, in the case of embodiments without demodulator at the tool head, the carrier signal with the useful signal by amplitude and frequency modulations. The result is that e.g. during a pulse of the useful signal a higher frequency of the actuator 20 is produced on account of the higher frequency of the control signal and that furthermore during a pulse of the useful signal a higher deflection of the actuator 20 is produced on account of the higher amplitude. Therefore, the impacts of the tool cutting edge of the tool tip 91 penetrate the surface of the workpiece 90 more deeply (greater penetration depth at a pulse of the useful signal) during a pulse of the useful signal and the impacts of the tool cutting edge of the tool tip 91 are at a different frequency (e.g. a higher frequency at a pulse of the useful signal), and therefore the pattern on the surface can be produced by depths and heights and by different shadings in the surface structuring.

Figure 5:
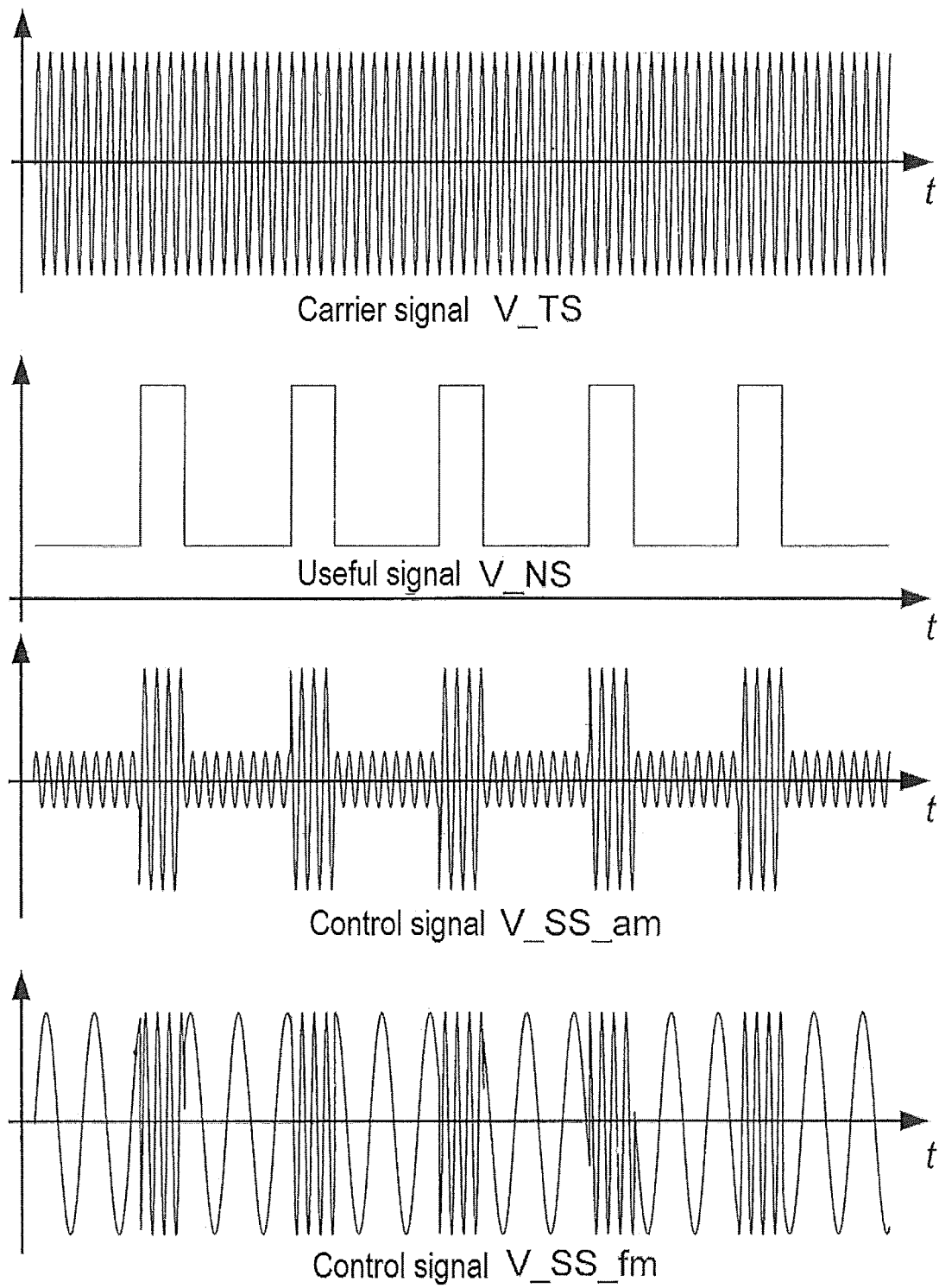
FIG. 5 shows, for instance, examples of a carrier signal, a useful signal, an amplitude-modulated control signal and a frequency-modulated control signal according to embodiments.

FIG. 5 shows for instance examples of a carrier signal, a useful signal, an amplitude-modulated control signal and a frequency-modulated control signal according to some embodiments.

This illustrates e.g. a high-frequency sinus-shaped carrier signal V_TS and a (merely exemplary) periodic useful signal V_NS with e.g. rectangular pulses. It should be noted that the useful signal V_NS as a rule does not have periodically occurring pulses of equal pulse width since the pulse frequency and pulse width vary individually depending on the respective pattern.

As an example, FIG. 5 also shows control signals which can be generated by modulation of the carrier signal V_TS on the basis of the useful signal V_NS, specifically e.g. the amplitude-modulated control signal V_SS_am and the frequency-modulated control signal V_SS_fm.

Figure 3A:
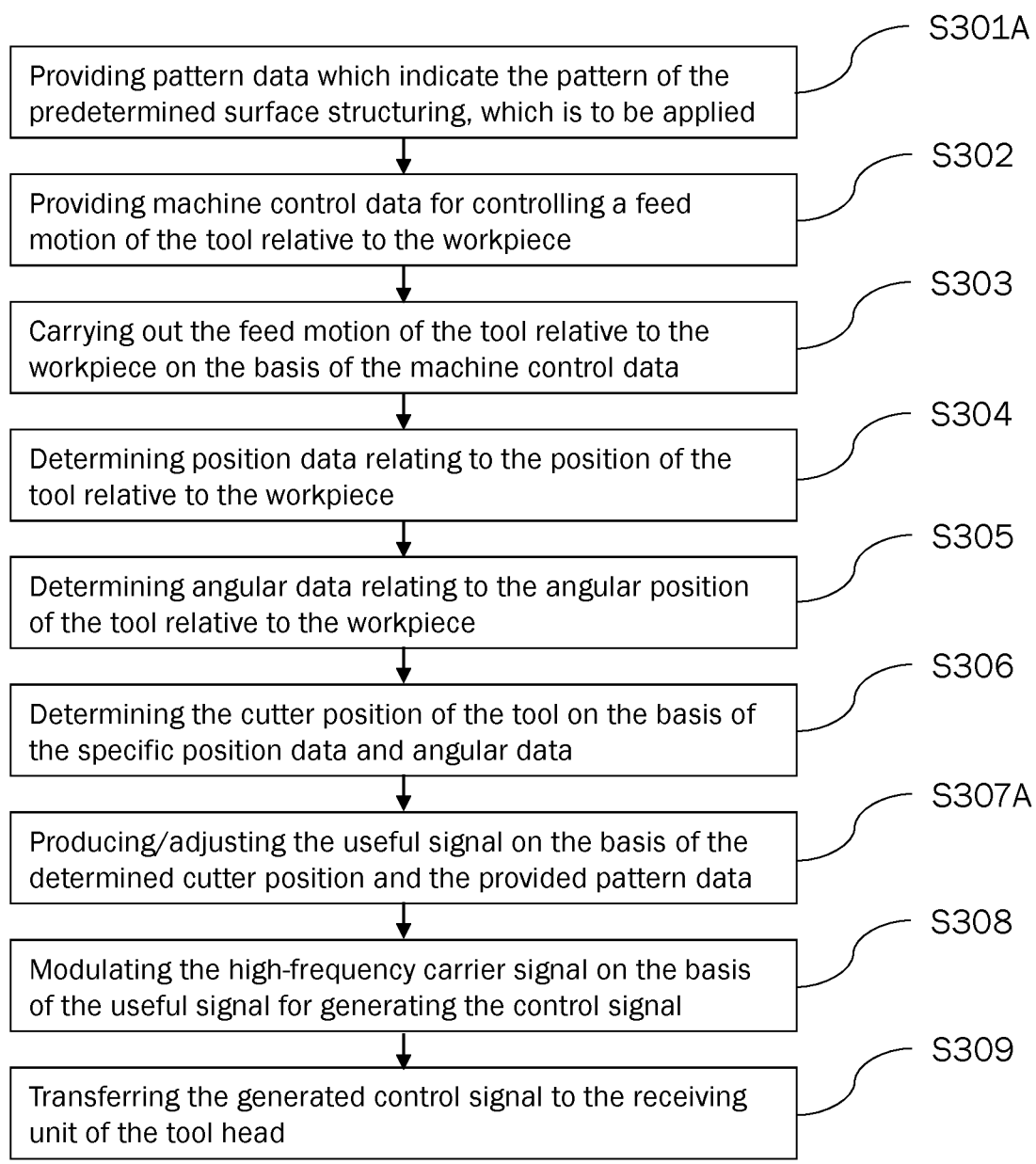
FIG. 3A shows, by way of example, a flow diagram of a method of transferring a control signal in a method for applying a surface structuring on a surface of a workpiece on a machine tool according to an embodiment.

FIG. 3A shows, by way of example, a flow diagram of a method of transferring a control signal in a method for applying a surface structuring to a surface of a workpiece WS on a machine tool 1000 according to an embodiment.

In step S301A, pattern data is provided which indicates the pattern of the predetermined surface structuring that is to be applied. Said data can be e.g. image data which indicates the text and/or image pattern to be applied (e.g. bitmap graphics data or image data in another image data format, e.g. as a JPEG file).

In step S302, machine control data is provided for controlling the feed motion of the tool 90 relative to the workpiece WS. This can comprise e.g. NC data (e.g. one or more NC programs) which describe a feed motion of the tool along the surface of the workpiece WS, e.g. for carrying out a face-milling process over the surface of the workpiece WS. If the workpiece has a freeform surface, the workpiece WS is preferably processed on the freeform surface in such a way that the machine control data indicates a feed motion where the tool axis 92 is always aligned in each moment coaxially with the respective (orientation changing) normal vector of the workpiece WS. In the case of a planar workpiece surface at the site of the pattern to be applied, the feed motions are preferably performed with constant orientation of the workpiece axis 92 perpendicular to the workpiece surface.

In step S303, the feed motion of the tool 90 relative to the workpiece WS is carried out by the machine control 1110 on the basis of the machine control data.

During the processing and the performed feed motion, always current position data is determined in step S304 in real time (see above), which directly or indirectly (i.e. e.g. after calculation from the position data) indicates the position of the tool axis 92 of the tool 90 and/or the position of the tool 90.

In step S305, angular data is determined simultaneously to step S305, which directly or indirectly (i.e. e.g. according to calculation from the angular data) indicates the angular position of the tool 90 and/or the tool tip 91.

In step S306, the current cutter position of the tool tip 91 of the tool 90 is determined or calculated on the basis of the position and angular data. Therefore, the position of the tool tip 91 of the tool 90 over the surface of the workpiece is known at this point in time.

On the basis of the determined current cutter position of the tool tip 91 of the tool 90, the corresponding useful signal is generated in step S307A on the basis of the predetermined pattern data, in particular e.g. in such a way that the useful signal has a deflection pulse or pulse (a higher or high amplitude) at some positions of the pattern (or when the tool tip is located at a position of the pattern) and has no deflection pulse or pulse (i.e. a lower or low amplitude) at other positions (or when the tool tip is not located at a position of the pattern).

In step S308, the high-frequency carrier signal is modulated with the useful signal and produces the modulated control signal, which is then transferred in step S309 to the receiving unit 34 of the tool head 10.

In the above example, the useful signal is generated in step S307A in real time on the basis of the pattern data (e.g. image data or bitmap image data). In further embodiments, another data type can be produced e.g. prior to processing, said data being produced on the basis of pattern data (e.g. image data and/or bitmap image data) and indicating positions on the tool surface (e.g. in the machine tool coordinate system) where the pattern is to be applied. This can be e.g. a table. In particular this can be data (pattern position data) which is generated on the basis of the image data and indicates positions of the pattern (e.g. pixel positions) on the surface of the workpiece WS in the workpiece and/or machine tool coordinate system.

Figure 3B:
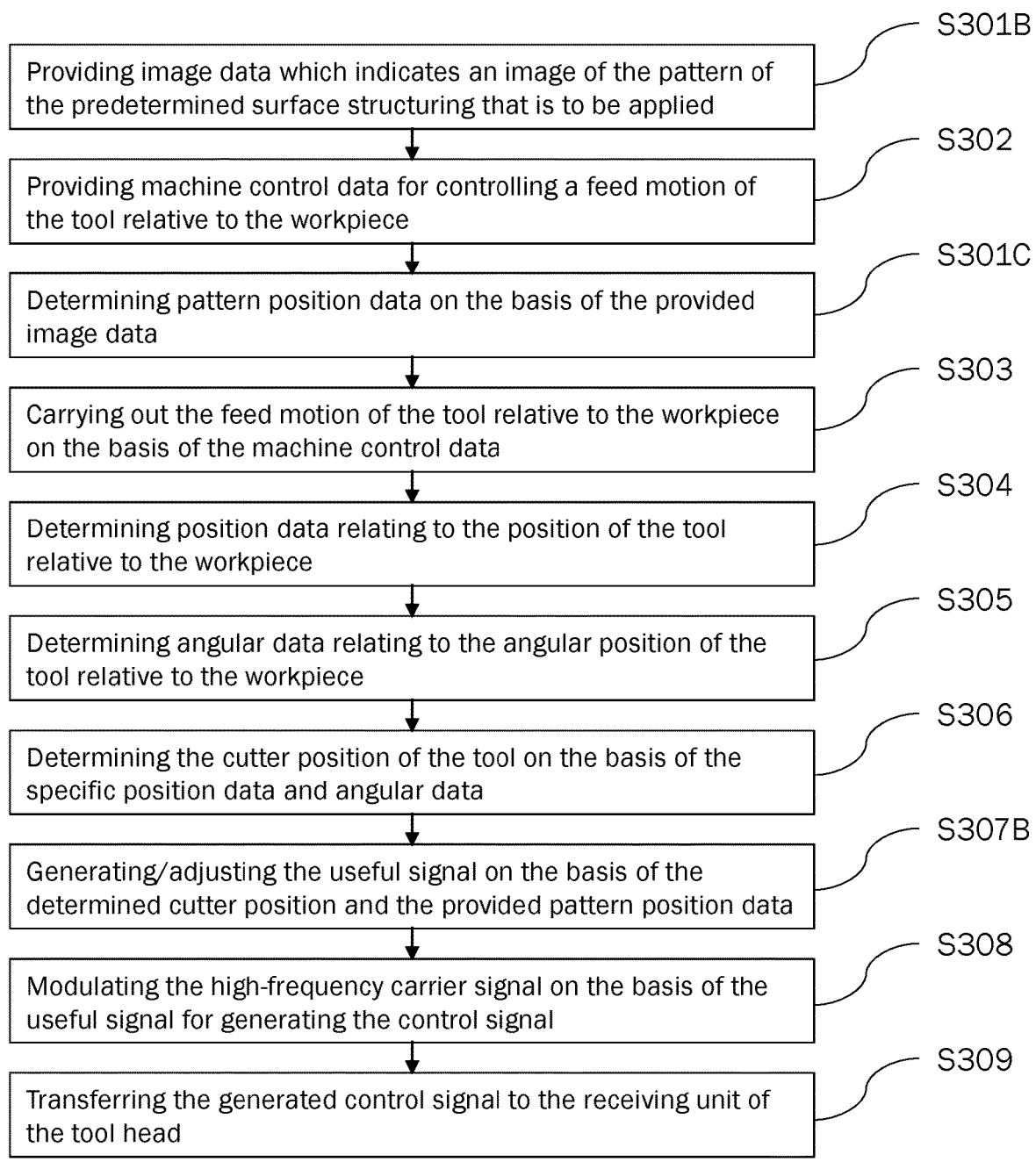
FIG. 3B shows, by way of example, a flow diagram of a method for transferring a control signal in a method for applying a surface structuring to a surface of a workpiece on a machine tool according to a further embodiment.

FIG. 3B shows, by way of example, a flow diagram of a method of transferring a control signal in a method for applying a surface structuring to a surface of a workpiece on a machine tool according to a further embodiment.

In step 301B, image data is provided which indicates the pattern in an image data format, and in step S301C, it is converted into pattern position data no longer in, but e.g., prior to the actual processing method, and/or pattern position data is determined on the basis of image data which indicates e.g. positions of the pattern on the surface of the workpiece WS (e.g. in the workpiece and/or machine tool coordinate system).

In step S307B, the useful signal is then generated or adjusted in real time during the processing of the workpiece on the basis of the determined pattern position data and the determined cutter position. This renders possible, if necessary, faster and more efficient data processing in real time since simplified usable pattern position data is already produced and/or determined before the processing method starts (e.g. from S303).

The other steps S302, S303, S304, S305, S306, S308 and S309 can be carried out by analogy with FIG. 3A.

Figure 4A:
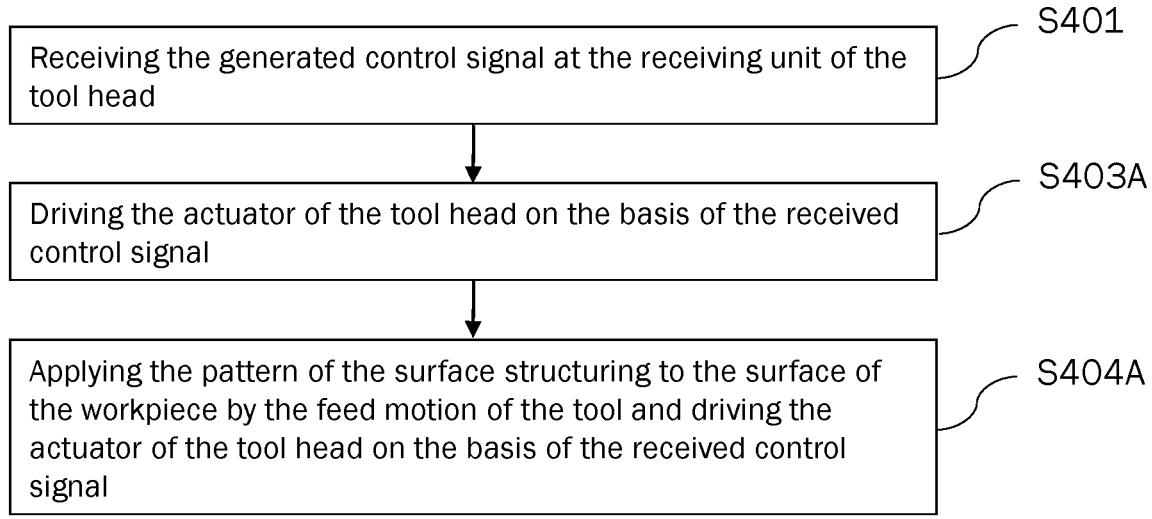
FIG. 4A shows, by way of example, a flow diagram of a method of receiving a control signal and applying a surface structuring to a surface of a workpiece on a machine tool according to an embodiment.

FIG. 4A shows by way of example a flow diagram of a method for receiving a control signal and applying a surface structuring to a surface of a workpiece on a machine tool according to an embodiment.

In step S401, the control signal transferred in step S309 (according to FIG. 3A or FIG. 3B) is received at the receiving unit 34 of the tool head 10 (e.g. inductively) and in step S403A by way of example directly outputted to the actuator 20 so as to control the actuator on the basis of the received control signal.

Therefore, e.g. the pattern of the surface structuring is applied to the surface of the workpiece in step S404A by the controlled feed motion (step S303) and the driving of the actuator 20 (S403A) on the basis of the received (modulated) control signal.

Figure 4B:
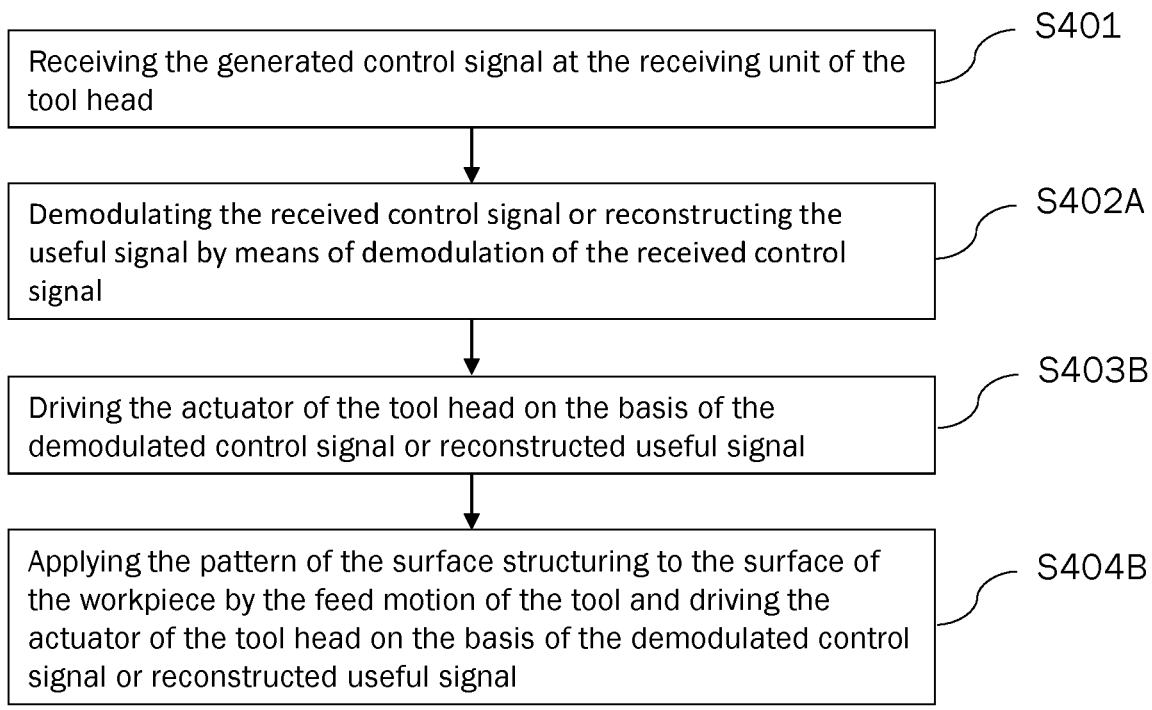
FIG. 4B shows, by way of example, a flow diagram of a method of receiving a control signal and applying a surface structuring to a surface of a workpiece on a machine tool according to a further embodiment.

FIG. 4B shows, by way of example, a flow diagram of a method of receiving a control signal and applying a surface structuring to a surface of a workpiece on a machine tool according to a further embodiment.

In step S401, the control signal transferred in step S309 (according to FIG. 3A or FIG. 3B) is received at the receiving unit 34 of the tool head 10 (e.g. inductively) and is demodulated in step S402 at the demodulator 15 of the tool head 10 in particular for reconstructing the useful signal from the modulated control signal.

The demodulated control signal and/or the reconstructed useful signal is outputted in S403B e.g. to the actuator 20, such that the actuator is controlled on the basis of the demodulated control signal and/or the reconstructed useful signal.

Therefore, e.g. the pattern of the surface structuring is applied to the surface of the workpiece in step S404B by the controlled feed motion (step S303) and the driving of the actuator 20 (S403B) on the basis of the demodulated control signal and/or reconstructed useful signal.

Examples and/or embodiments of the present invention and the advantages thereof are described above in detail with reference to the attached drawings.

However, it should be noted again that the present invention is by no means limited or confined to the above described embodiments and the design features thereof but furthermore comprises modifications of the embodiments, in particular those which are comprised by modifications of the features of the described examples and/or by combination of individual or a plurality of the features of the described examples within the scope of the independent claims.

The invention claimed is:

1. A method for applying a surface structuring to a surface of a workpiece on a machine tool, comprising:
performing a feed motion of a milling cutter which is rotationally driven by a work spindle of the machine tool, is received in a tool head of the machine tool and has at least one protruding cutting edge along the surface of the workpiece, applying the surface structuring in accordance with a predetermined pattern to the surface of the workpiece during the feed motion of the milling cutter on the basis of a control signal to an actuator which is integrated in the tool head and is configured to drive a vibration of the milling cutter on the basis of the control signal, wherein the control signal comprises a high-frequency carrier signal and a useful signal which modulates the carrier signal and which is generated on the basis of data indicating the predetermined pattern.

2. The method according to claim 1, wherein
the data indicating the predetermined pattern comprises image data.

3. The method according to claim 1, wherein
the control signal is transferred in a contactless way to a receiving unit arranged on the tool head via a sending unit arranged on the work spindle.

4. The method according to claim 1, wherein
the actuator is driven on the basis of the modulated control signal.

5. The method according to claim 1, wherein,
after the demodulation of the control signal, the actuator is driven on the basis of the useful signal.

6. The method according to claim 1, wherein
the high-frequency carrier signal is amplitude-modulated on the basis of the useful signal.

7. The method according to claim 6, wherein
the surface structuring has a pattern corresponding to the predetermined pattern.

8. The method according to claim 1, wherein
the high-frequency carrier signal is frequency-modulated on the basis of the useful signal.

9. The method according to claim 1, wherein
the carrier signal has a frequency in the ultrasonic range.

10. The method according to claim 1, wherein
the actuator is configured to drive a vibration in an axial direction of the milling cutter.

11. The method according to claim 1, wherein
the actuator comprises one or more piezo elements.

12. The method according to claim 1, wherein
an axial direction of the tool is aligned parallel to a normal vector of the surface of the workpiece during the feed motion along the surface of the workpiece.

13. The method according to claim 1, wherein
the tool is moved perpendicular to a normal vector of the surface of the workpiece during the feed motion along the surface of the workpiece.

14. A control device of a machine tool for controlling a method according to claim 1, comprising
a storage apparatus for storing data indicating the predetermined pattern and/or a receiving apparatus for receiving data indicating the predetermined pattern, and
a control signal generating apparatus for generating the control signal with the high-frequency carrier signal and the useful signal which modulates the carrier signal and which is generated on the basis of the data indicating the predetermined pattern.

15. A machine tool comprising
a control device according to claim 14,
a tool head which is configured to receive a milling cutter having at least one protruding cutting edge and
an actuator which is integrated in the tool head and is configured to drive a vibration of the incorporated milling cutter on the basis of the control signal of the control device.

16. A computer program product comprising a computer program stored on a computer-readable data storage medium, which can be run on a numerical control device of a numerically controlled machine tool or in a computer connected to a control device of a numerically controlled machine tool and which is configured to control a method according to claim 1 on the machine tool.

* * * * *